US006786736B2

(12) United States Patent
Flannery et al.

(10) Patent No.: US 6,786,736 B2
(45) Date of Patent: Sep. 7, 2004

(54) SURFACE MOUNT INTERCONNECT AND DEVICE INCLUDING SAME (75) Inventors: John Flannery, Cork (IE); Michael Gray, Cork (IE)

(73) Assignee: Artesyn Technologies, Inc., Boca Raton, FL (US)

( * ) Notice: Subject to any disclaimer, the term of this patent is extended or adjusted under 35 U.S.C. 154(b) by 0 days.

(21) Appl. No.: 10/226,830

(22) Filed: Aug. 23, 2002

(65) Prior Publication Data

US 2004/0038559 A1 Feb. 26, 2004

(51) Int. Cl.[7] .............................................. H01R 12/00
(52) U.S. Cl. ........................................................ 439/66
(58) Field of Search ........................... 439/66, 91, 74; 361/803, 774, 770, 804

(56) References Cited

U.S. PATENT DOCUMENTS

| 5,427,535 | A | * | 6/1995 | Sinclair | 439/66 |
|---|---|---|---|---|---|
| 5,588,848 | A | | 12/1996 | Law et al. | 439/83 |
| 5,618,188 | A | * | 4/1997 | Gilmore et al. | 439/91 |
| 5,842,275 | A | | 12/1998 | McMillan, II et al. | 29/840 |
| 5,956,235 | A | * | 9/1999 | Kresge et al. | 361/774 |
| 5,957,703 | A | * | 9/1999 | Arai et al. | 439/66 |
| 5,969,952 | A | * | 10/1999 | Hayashi et al. | 361/774 |
| 5,984,692 | A | * | 11/1999 | Kumagai et al. | 439/66 |
| 6,059,579 | A | * | 5/2000 | Kresge et al. | 439/66 |
| 6,246,587 | B1 | | 6/2001 | Chen | 361/773 |
| 6,271,482 | B1 | * | 8/2001 | Crotzer et al. | 174/262 |
| 6,280,207 | B1 | * | 8/2001 | Sakata et al. | 439/91 |
| 6,310,301 | B1 | | 10/2001 | Heinrich et al. | 174/260 |
| 6,392,899 | B1 | * | 5/2002 | Harrison et al. | 361/803 |
| 6,503,088 | B2 | * | 1/2003 | Roy | 439/65 |

* cited by examiner

*Primary Examiner*—Tulsidas C. Patel
(74) *Attorney, Agent, or Firm*—Kirkpatrick & Lockhart LLP (57) ABSTRACT A surface mount interconnect is disclosed. The interconnect includes a solid conductor having a first section, a second section, and a central section between the first and second sections. The first section includes at least one curved surface, and the second section includes at least one curved surface. The central section includes first and second planar surfaces.

26 Claims, 7 Drawing Sheets

SURFACE MOUNT INTERCONNECT AND DEVICE INCLUDING SAME

BACKGROUND OF INVENTION

The circuits designed to meet the demands placed on today's power supplies are becoming increasingly complex. Two such demands are decreased device size and increased device density. To reduce size, many of the complex circuits used to meet the demands require the use of an auxiliary substrate electrically and mechanically connected to a primary substrate. The use of the auxiliary substrate permits the surface area of the primary substrate to be reduced in size. To increase device density, components are mounted to both the primary substrate and the auxiliary substrate, and many power supplies utilize the relatively smaller surface mount components whenever possible.

The primary substrate and the auxiliary substrate are typically connected to one another electrically and mechanically via through-hole pins or a surface mount interconnect. The use of through-hole pins typically requires at least one additional manufacturing step and tends to be more expensive. However, the use of through-hole pins also tends to result in more accurate positioning of the primary substrate relative to the auxiliary substrate. Although the use of surface mount interconnects tends to be less expensive, the use of surface mount interconnects typically increases the potential for displacement of the auxiliary substrate from the desired mounting position on the primary substrate.

SUMMARY

In one general respect, the present invention is directed to a surface mount interconnect. According to one embodiment, the surface mount interconnect includes a solid conductor having a first section, a second section, and a central section between the first and second sections. The first section includes at least one curved surface, and the second section includes at least one curved surface. The central section includes first and second planar surfaces. According to other embodiments, the solid conductor may further include first and second end sections. The first end section includes third and fourth planar surfaces, and the second end section includes fifth and sixth planar surfaces.

In another general respect, the present invention is directed to a power supply. According to one embodiment, the power supply includes a substrate, a power component mounted to the substrate, and a surface mount interconnect mounted to the substrate. The interconnect includes a solid conductor having a first section, a second section, and a central section between the first and second sections. The first section includes at least one curved surface, and the second section includes at least one curved surface. The central section includes a first planar surface connected to the substrate, and a second planar surface for connection to another substrate.

In another general respect, the present invention is directed to a device. According to one embodiment, the device includes a first substrate, a second substrate, and a surface mount interconnect electrically and mechanically connected to the first and second substrates. The interconnect is a solid conductor which includes a first section, a second section, and a central section between the first and second sections. The first section includes at least one curved surface, and the second section includes at least one curved surface. The central section includes a first planar surface connected to the first substrate, and a second planar surface connected to the second substrate.

DESCRIPTION OF THE DRAWINGS

FIG. 2 illustrates one embodiment of a rectangular solid that the interconnect of FIG. 1 may be fabricated from;

FIG. 4 illustrates one embodiment of a rectangular solid that the interconnect of FIG. 3 may be fabricated from;

DETAILED DESCRIPTION OF THE INVENTION

Figure 1:
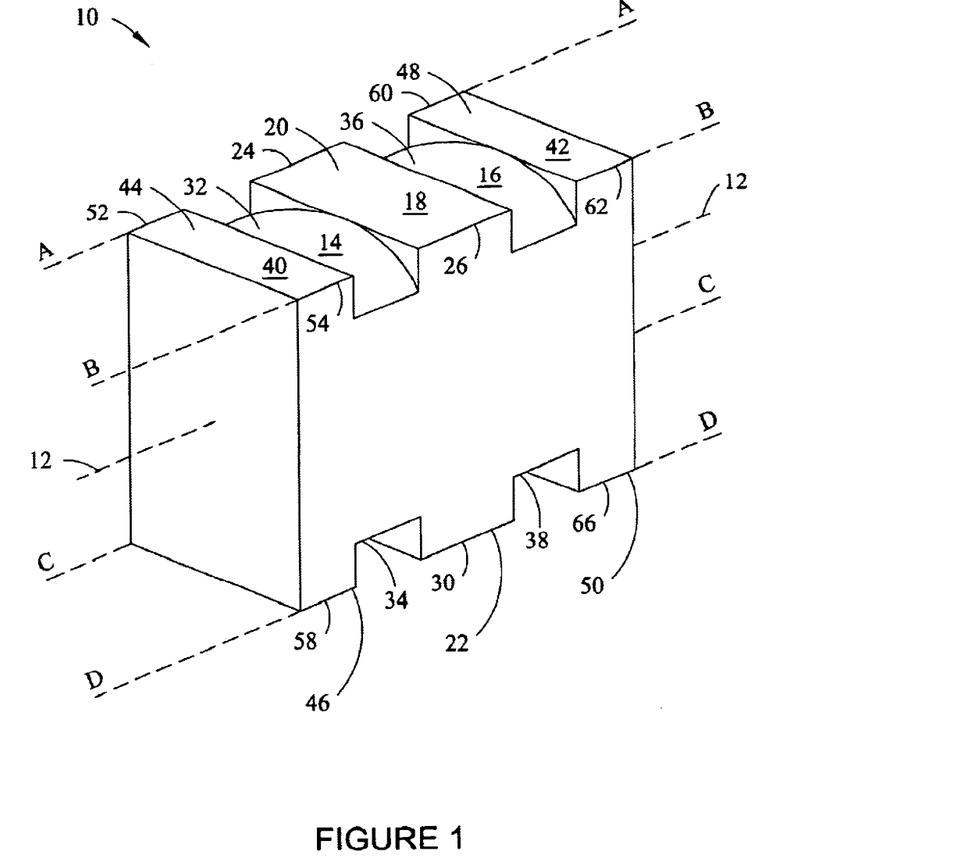
FIG. 1 illustrates a surface mount interconnect according to one embodiment of the present invention.

FIG. 1 illustrates a surface mount interconnect 10 according to one embodiment of the present invention. The interconnect 10 may be used to provide an electrical and mechanical connection between two adjacent substrates, printed circuit boards, printed wiring boards, or any combination thereof.

As shown in FIG. 1, the interconnect 10 may be symmetrical about a longitudinal axis 12. The interconnect 10 may be a solid conductor, thereby having a higher current carrying capability than hollow surface mount interconnects of similar size. The interconnect 10 may include a first section 14 having at least one curved surface, a second section 16 having at least one curved surface, and a central section 18 between the first and second sections 14, 16.

The central section 18 may include first and second planar surfaces 20, 22. As illustrated in FIG. 1, the first planar surface 20 may comprise a portion of the upper surface of the interconnect 10, and the second planar surface 22 may comprise a portion of the lower surface of the interconnect 10. According to one embodiment, the first planar surface 20 may be connected to a first substrate, and the second planar surface 22 may be connected to a second substrate. The first and second planar surfaces 20, 22 may be sized to accommodate a vacuum nozzle of a pick and place machine. The first planar surface 20 may include first and second edges 24, 26, and the first edge 24 may be opposite the second edge 26. The second planar surface 22 may include third and fourth edges 28, 30, and the third edge 28 may be opposite the fourth edge 30.

The first section 14 may include first and second curved surfaces 32, 34, and the first curved surface 32 may be opposite the second curved surface 34. The second section 16 may include third and fourth curved surfaces 36, 38, and the third curved surface 36 may be opposite the fourth curved surface 38. The first and third surfaces 32, 36 may be adjacent the first planar surface 20 of the central section 18. The second and fourth curved surfaces 34, 38 may be adjacent the second planar surface 22 of the central section 18. As shown in FIG. 1, the first and second sections 14, 16 may be congruent (i.e., superposable so as to be coincident throughout).

The interconnect 10 may further include first and second end sections 40, 42. As shown in FIG. 1, the first and second end sections 40, 42 may be congruent. The first end section 40 may be adjacent the first section 14, and may include third and fourth planar surfaces 44, 46. The second end section 42 may be adjacent the second section 16, and may include fifth and sixth planar surfaces 48, 50. The third planar surface 44 may be opposite the fourth planar surface 46, and the fifth planar surface 48 may be opposite the sixth planar surface 50. The third and fifth planar surfaces 44, 48 may be coplanar with the first planar surface 20, and the fourth and sixth planar surfaces 46, 50 may be coplanar with the second planar surface 22.

The third planar surface 44 may include fifth and sixth edges 52, 54, and the fifth edge 52 may be opposite the sixth edge 54. The fourth planar surface 46 may include seventh and eighth edges 56, 58, and the seventh edge 56 may be opposite the eighth edge 58. The fifth planar surface 48 may include ninth and tenth edges 60, 62, and the ninth edge 60 may be opposite the tenth edge 62. The sixth planar surface 50 may include eleventh and twelfth edges 64, 66, and the eleventh edge 64 may be opposite the twelfth edge 66.

The first, fifth, and ninth edges 24, 52, 60 may be collinear, and the second, sixth, and tenth edges 26, 54, 62 may be collinear. Together the first, fifth, and ninth edges 24, 52, 60 may comprise edge "A" of the interconnect 10, and the second, sixth, and tenth edges 26, 54, 62 may comprise edge "B" of the interconnect 10. The third, seventh, and eleventh edges 28, 56, 64 may be collinear, and the fourth, eighth, and twelfth edges 30, 58, 66 may be collinear. Together, the third, seventh, and eleventh edges 28, 56, 64 may comprise edge "C" of the interconnect 10, and the fourth, eighth, and twelfth edges 30, 58, 66 may comprise edge "D" of the interconnect 10.

Figure 2:
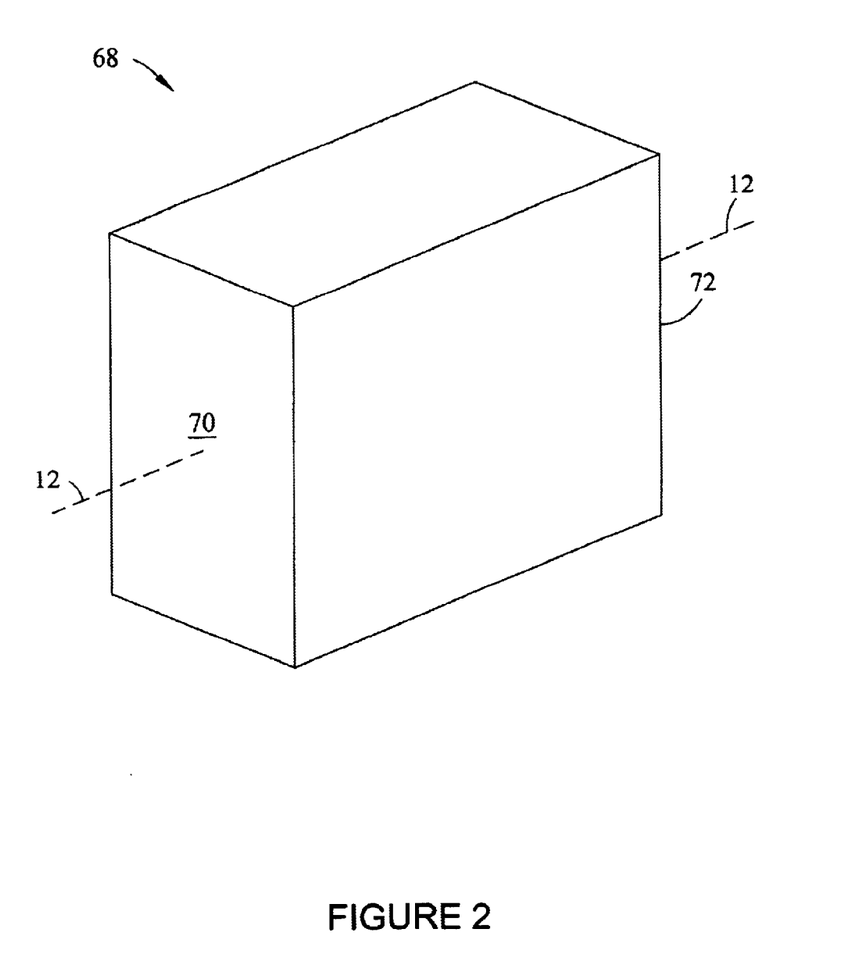

FIG. 2 illustrates one embodiment of a rectangular solid 68 from which the interconnect 10 of FIG. 1 may be fabricated. The interconnect 10 may be fabricated from the rectangular solid 68 using stationary and rotating cutting tools. The rectangular solid 68 may be comprised of a material having high electrical and thermal conductivity. For example, according to one embodiment, the rectangular solid 68 may be comprised of copper or a machinable alloy of copper. According to another embodiment, the rectangular solid 68 may be comprised of aluminum or brass. The rectangular solid 68 may include first and second rectangular end faces 70, 72.

To fabricate the interconnect 10, the rectangular solid 68 may be rotated about the axis 12. While the rectangular solid 68 is being rotated about the axis 12, cutting tools may be used to remove material from the rectangular solid 68 to produce the interconnect 10. According to one embodiment, each of the curved surfaces 32, 34, 36, 38 of the interconnect 10 may be produced using a turning process, and each of the planar surfaces 20, 22, 44, 46, 48, 50 of the interconnect 10 may be produced using a polygon turning process. According to another embodiment, the interconnect 10 may be fabricated from a cylindrical solid (not shown) rather than the rectangular solid 68 of FIG. 2.

Figure 3:
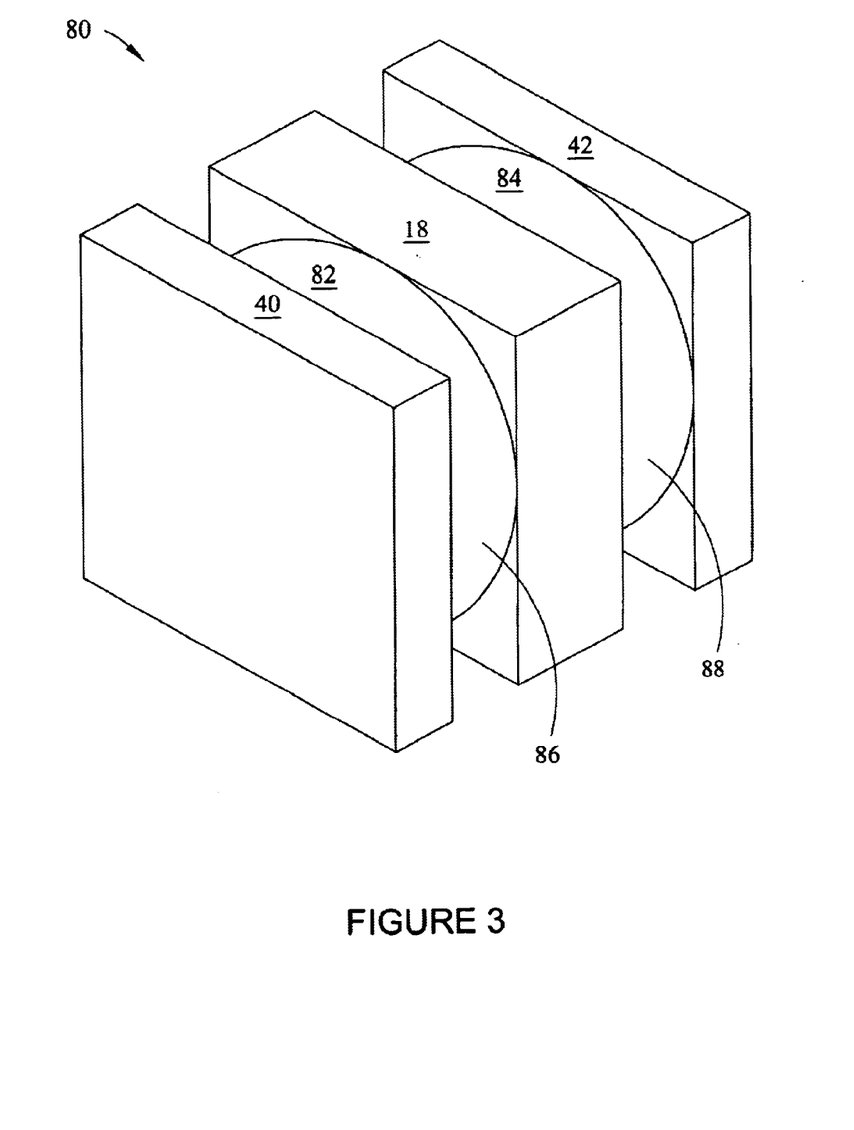
FIG. 3 illustrates a surface mount interconnect according to another embodiment of the present invention.

FIG. 3 illustrates a surface mount interconnect 80 according to another embodiment of the present invention. The interconnect 80 may include a central section 18, and first and second end sections 40, 42 as described hereinabove with respect to FIG. 1. The interconnect 80 may also include first and second sections 82, 84. According to this embodiment, the first section 82 may include a first cylindrical surface 86, and the second section 84 may include a second cylindrical surface 88. The first section 82 may comprise a first segmented cylinder, and the second section 84 may comprise a second segmented cylinder. As shown in FIG. 3, the first and second sections 82, 84 may be congruent.

Figure 4:
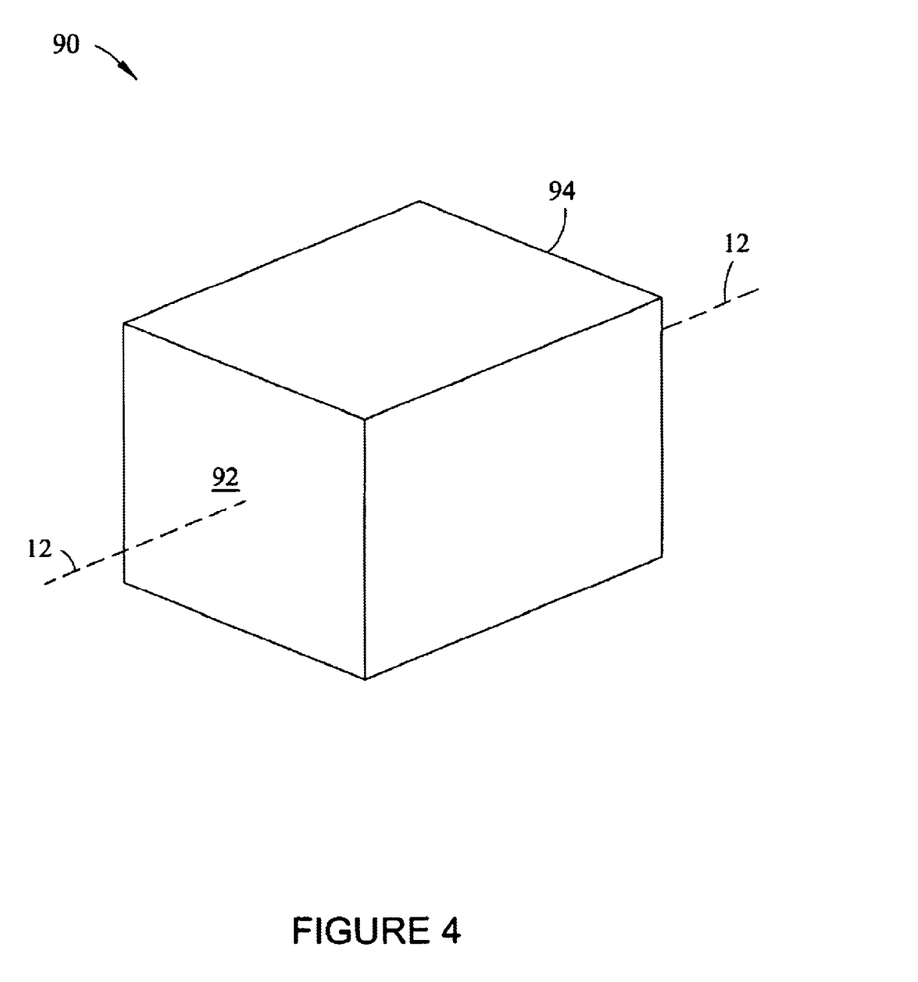

FIG. 4 illustrates one embodiment of a rectangular solid 90 that the interconnect 80 of FIG. 3 may be fabricated from. The interconnect 80 may be fabricated from the rectangular solid 90 using stationary and rotating cutting tools. The rectangular solid 90 may be comprised of a material having high electrical and thermal conductivity. For example, according to one embodiment, the rectangular solid 90 may be comprised of copper or a machinable alloy of copper. According to another embodiment, the rectangular solid 90 may be comprised of aluminum or brass. The rectangular solid 90 may include first and second square end faces 92, 94.

To fabricate the interconnect 80, the rectangular solid 90 may be rotated about the axis 12. While the rectangular solid 90 is being rotated about the axis 12, cutting tools may be used to remove material from the rectangular solid 90. According to one embodiment, the first and second cylindrical surfaces 86, 88 of the interconnect 80 may be produced using a turning process, and each of the planar surfaces 20, 22, 44, 46, 48, 50 of the interconnect 80 may be produced using a polygon turning process. According to another embodiment, the interconnect 80 may be fabricated from a cylindrical solid (not shown) rather than the rectangular solid 90 of FIG. 3.

Figure 5:
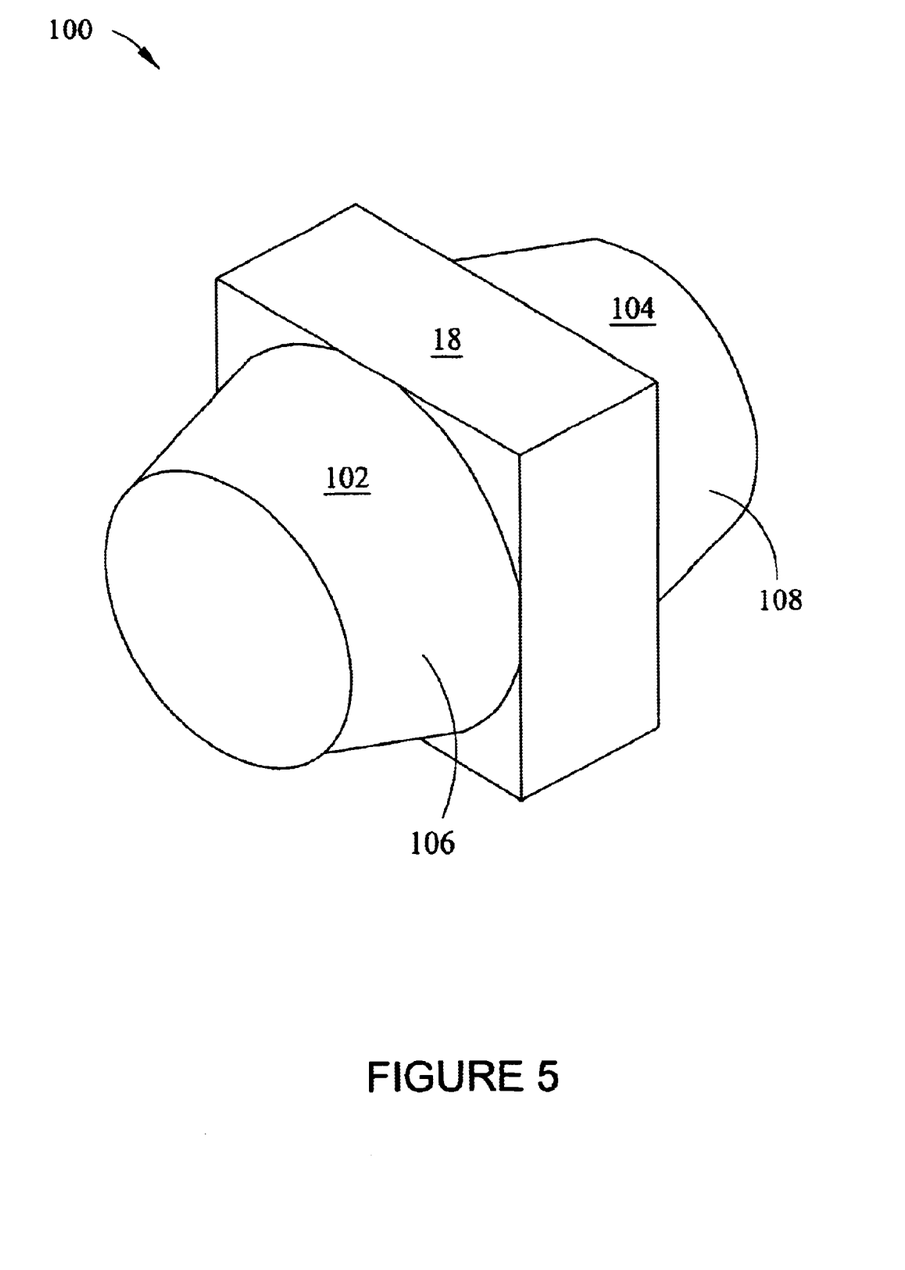
FIG. 5 illustrates a surface mount interconnect according to another embodiment of the present invention.

FIG. 5 illustrates a surface mount interconnect 100 according to another embodiment of the present invention. The interconnect 100 may include a central section 18 as described hereinabove with respect to FIG. 1. The interconnect 100 may also include first and second sections 102, 104. According to this embodiment, the first section 102 may include a first conical surface 106, and the second section 104 may include a second conical surface 108. The first section 102 may comprise a first segmented cone, and the second section 104 may comprise a second segmented cone. As shown in FIG. 5, the first and second sections 102, 104 may be congruent.

According to one embodiment, the interconnect 100 may be fabricated from a rectangular solid 68 as illustrated in FIG. 2, in a manner similar to that described for interconnect 10. According to another embodiment, the interconnect 100 may be fabricated from a rectangular solid 90 as illustrated in FIG. 4, in a manner similar to that described for interconnect 80. Alternatively, the interconnect 100 may be fabricated from a cylindrical solid in a manner similar to that described hereinabove for interconnect 10 or interconnect 80.

Figure 6:
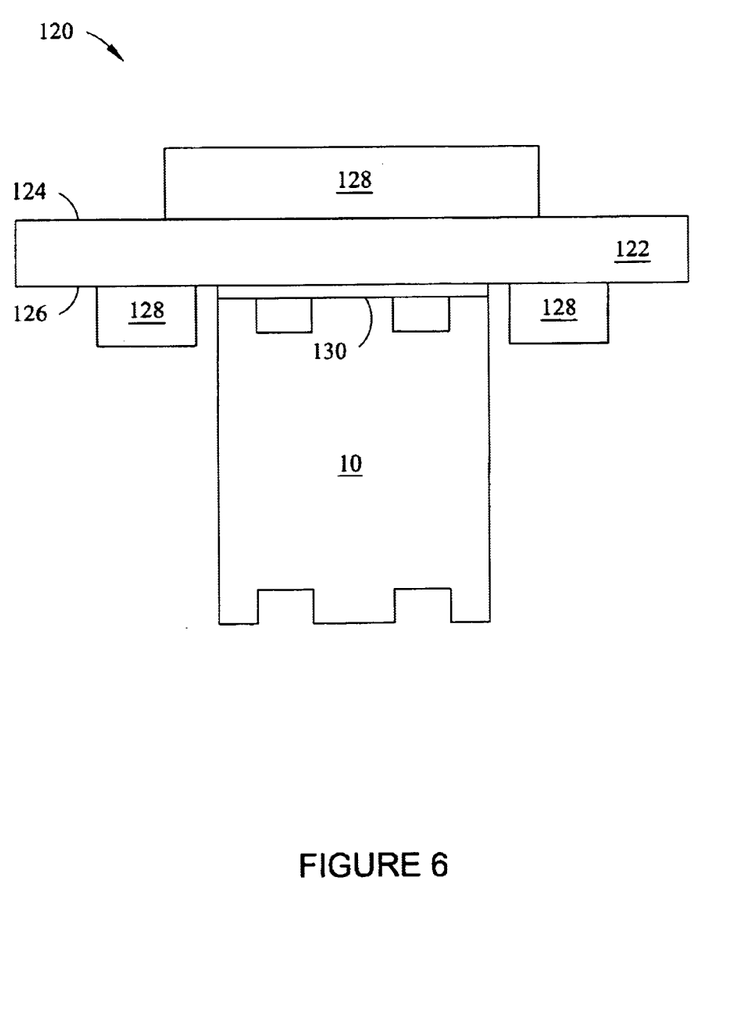
FIG. 6 illustrates one embodiment of a surface mount power supply power that includes the interconnect of FIG. 1.

FIG. 6 illustrates one embodiment of a surface mount power supply 120 that includes the interconnect 10 of FIG. 1. The power supply 120 may also include a substrate 122 having a first and second surface 124, 126, and one or more power components 128 mounted to the substrate 122. The components 128 may be mounted to the first surface 124, the second surface 126, or to both the first and second surfaces 124, 126 of the substrate 122. The components 128 may be, for example, discrete electrical components (such as transistors, diodes, capacitors, resistors, etc.), or planar magnetic assemblies (such as transformers or inductors). The substrate 122 may include a conductive pad 130 having a layer of solder paste deposited thereon. The interconnect 10 may be electrically and thermally connected to the substrate 122 via the conductive pad 130.

According to one embodiment, a pick and place machine may be used to automatically pick the interconnect 10 from a standard tape and reel format package. A vacuum nozzle of the pick and place machine may be brought into contact with the first planar surface 20 of the interconnect 10 to pick the interconnect 10 from the standard tape and reel format package. Once the interconnect 10 has been picked, the pick and place machine may then place the interconnect 10 onto a surface of the conductive pad 130 such that the second, fourth and sixth planar surfaces 22, 46, 50 of the interconnect 10 are immersed in the solder paste of the conductive pad 130. When the solder paste is brought to reflow temperature using conventional soldering techniques such as convection, infrared, or vapor phase, the combination of the symmetry of the interconnect 10 and the third and fourth curved surfaces 36, 38 of the first and second sections 14, 16, respectively, may produce a uniform and even build-up of solder between the interconnect 10 and the conductive pad 130 of the substrate 122. This uniform and even build-up of solder may facilitate self-centering of the interconnect 10 on the conductive pad 130, due to equal but opposing wetting forces set up as a result of fillets formed between the conductive pad 130 and the third and fourth curved surfaces 36, 38 of the first and second sections 14, 16, respectively. The uniform and even build-up of solder may also facilitate the second, fourth and sixth planar surfaces 22, 46, 50 of the interconnect 10 to set coplanar with the surface of the conductive pad 130 due to equal but opposing wetting forces along the "C" and "D" edges of the interconnect 10. In addition, the third and fourth curved surfaces 36, 38 may also promote the release of gases trapped in the heated solder, thereby discouraging any displacement of the interconnect 10 from the desired mounting position. The resulting solder joint between the interconnect 10 and the substrate 122 exhibits a high shear strength.

According to another embodiment, the first, second, third and fourth curved surfaces 32, 34, 36, 38 of interconnect 10 may be plated with solder or other solderable material following the fabrication of the interconnect 10 from the rectangular solid 68. The plating may include, for example, a 60/40 Sn/Pb composition, and may facilitate the formation of the fillets between the conductive pad 130 and the third and fourth curved surfaces 36, 38 of the interconnect 10 during the soldering process. According to another embodiment, one or more areas of the rectangular solid 68 removed during fabrication of the first and second sections 14, 16 may be loaded with solder or other solderable material following the fabrication of the interconnect 10. The loaded solder or other solderable material may facilitate the formation of the fillets between the conductive pad 130 and the third and fourth curved surfaces 36, 38 of the interconnect 10 during the soldering process. Once the interconnect 10 is electrically and mechanically connected to the substrate 122, the interconnect 10 may be used to electrically and mechanically fasten the power supply to another substrate.

Figure 7:
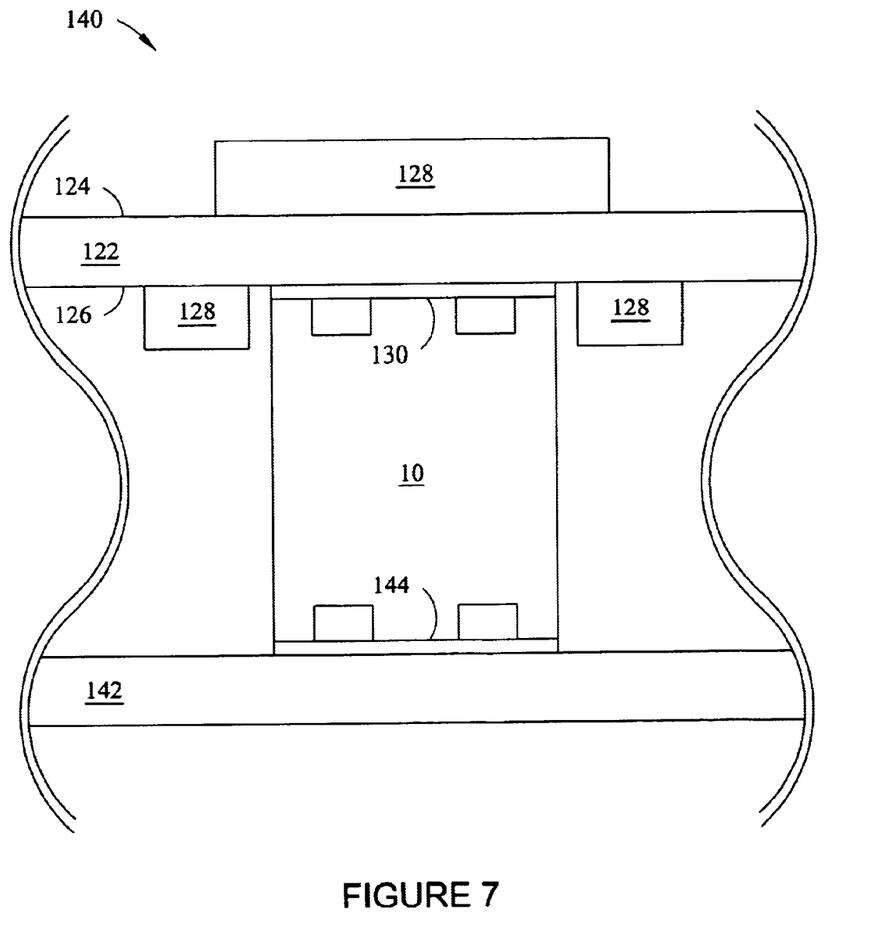
FIG. 7 illustrates one embodiment of a device that includes the power supply of FIG. 6.

FIG. 7 illustrates one embodiment of a device 140 that includes the power supply of FIG. 6. The device 140 may also include a second substrate 142. According to one embodiment, the substrate 122 of the power supply 120 may be, for example, an auxiliary substrate, and the second substrate 142 may be, for example, a primary substrate. The second substrate 142 may include a second conductive pad 144 having a layer of solder paste deposited thereon, and may be electrically and mechanically connected to the interconnect 10 via the second conductive pad 144.

According to one embodiment, the second substrate 142 may be connected to the interconnect 10 in a fashion similar to the manner that the substrate 122 of the power supply 120 is connected to the interconnect 10 (as described hereinabove with respect to FIG. 6). For example, the interconnect 10 may be placed onto a surface of the second conductive pad 144 such that the first, third and fifth planar surfaces 20, 44, 48 of the interconnect 10 are immersed in the solder paste of the second conductive pad 144. When the solder paste is brought to reflow temperature using conventional soldering techniques such as convection, infrared, or vapor phase, the combination of the symmetry of the interconnect 10 and the first and second curved surfaces 32, 34 of the first and second sections 14, 16, respectively, may produce a uniform and even build-up of solder between the interconnect 10 and the second conductive pad 144 of the second substrate 142. This uniform and even build-up of solder may facilitate self-centering of the interconnect 10 on the second conductive pad 144, due to equal but opposing wetting forces set up as a result of fillets formed between the second conductive pad 144 and the first and second curved surfaces 32, 34 of the first and second sections 14, 16, respectively. The uniform and even build-up of solder may also facilitate the first, third and fifth planar surfaces 20, 44, 48 of the interconnect 10 to set coplanar with the surface of the second conductive pad 144 due to equal but opposing wetting forces along the "A" and "B" edges of the interconnect 10. In addition, the first and second curved surfaces 32, 34 may also promote the release of gases trapped in the heated solder, thereby discouraging any displacement of the interconnect 10 from the desired mounting position. The resulting solder joint between the interconnect 10 and the second substrate 142 exhibits a high shear strength.

As described hereinabove with respect to FIG. 6, the first, second, third and fourth curved surfaces 32, 34, 36, 38 of interconnect 10 may be plated with solder or solderable material following the fabrication of the interconnect 10 from the rectangular solid 68. The plating may facilitate the formation of the fillets between the second conductive pad 144 and the first and second curved surfaces 32, 34 of the interconnect 10 during the soldering process. In addition, as described hereinabove with respect to FIG. 6, one or more areas of the rectangular solid 68 removed during fabrication of the first and second sections 14, 16 may be loaded with solder or solderable material following the fabrication of the interconnect 10. The loaded solder or solderable material may facilitate the formation of the fillets between the second conductive pad 144 and the first and second curved surfaces 32, 34 of the interconnect 10 during the soldering process.

Although the present invention has been described and illustrated in detail herein with respect to certain embodiments, it is to be understood that the same is by way of example and is not to be taken by way of limitation. In addition, it will be appreciated by those of ordinary skill in the art that modifications and variations of the embodiments presented herein may be implemented without departing from the spirit and scope of the present invention as described in the appended claims. For example, the substrate 122 of the power supply 120 and the second substrate 142 may be electrically and mechanically connected via a plurality of interconnects 10. In addition, the substrate 122 of the power supply 120 and the second substrate 142 may be electrically and mechanically connected via the interconnect 80 (or a plurality thereof) as described hereinabove with respect to FIG. 3, or may be electrically and mechanically connected via the interconnect 100 (or a plurality thereof) as described hereinabove with respect to FIG. 5.

What is claimed is:

1. A surface mount interconnect, comprising:
   a solid conductor which includes:
      a first section having at least one curved surface;
      a second section having at least one curved surface; and
      a central section between the first and second sections,
         wherein the central section includes first and second planar surfaces, and wherein the solid conductor is symmetrical about a longitudinal axis that passes through the first section, the second section and the central section.

2. The interconnect of claim 1, wherein the first planar surface is opposite the second planar surface.

3. The interconnect of claim 1, wherein:
the first section includes first and second curved surfaces; and
the second section includes third and fourth curved surfaces.

4. The interconnect of claim 3, wherein:
the first curved surface is opposite the second curved surface; and
the third curved surface is opposite the fourth curved surface.

5. The interconnect of claim 3, wherein:
the first and third curved surfaces are adjacent the first planar surface; and
the second and third curved surfaces are adjacent the second planar surface.

6. The interconnect of claim 1, wherein the first and second sections are congruent.

7. The interconnect of claim 1, wherein:
the first section includes a first cylindrical surface; and
the second section includes a second cylindrical surface.

8. The interconnect of claim 7, wherein:
the first section comprises a first segmented cylinder; and
the second section comprises a second segmented cylinder.

9. The interconnect of claim 7, wherein the first and second sections are congruent.

10. The interconnect of claim 1, wherein:
the first section includes a first conical surface; and
the second section includes a second conical surface.

11. The interconnect of claim 10, wherein:
the first section comprises a first segmented cone; and
the second section comprises a second segmented cone.

12. The interconnect of claim 11, wherein the first and second sections are congruent.

13. The interconnect of claim 1, wherein the first and second sections are plated with a solderable material.

14. The interconnect of claim 1, further comprising:
a first end section adjacent the first section, wherein the first end section includes third and fourth planar surfaces; and
a second end section adjacent the second section, wherein the second end section includes fifth and sixth planar surfaces.

15. The interconnect of claim 14, wherein:
the third planar surface is opposite the fourth planar surface; and
the fifth planar surface is opposite the sixth planar surface.

16. The interconnect of claim 14, wherein:
the first, third and fifth planar surfaces are coplanar; and
the second, fourth and sixth planar surfaces are coplanar.

17. The interconnect of claim 14, wherein the first and second end sections are congruent.

18. A power supply, comprising:
a substrate;
a power component mounted to the substrate; and
a surface mount interconnect mounted to the substrate, wherein the interconnect is a solid conductor which includes:
a first section having at least one curved surface;
a second section having at least one curved surface; and
a central section between the first and second sections, wherein the central section includes:
a first planar surface connected to the substrate; and
a second planar surface for connection to another substrate, and wherein the solid conductor is symmetrical about a longitudinal axis that passes through the first section, the second section and the central section.

19. The power supply of claim 18, wherein the power component is a discrete electrical component.

20. The power supply of claim 18, wherein the power component is a planar magnetic assembly.

21. The power supply of claim 18, further comprising a second power component mounted to the substrate.

22. A device, comprising:
a first substrate;
a second substrate; and
a surface mount interconnect electrically and mechanically connected to the first and second substrates, wherein the interconnect is a solid conductor which includes:
a first section having at least one curved surface;
a second section having at least one curved surface; and
a central section between the first and second sections, wherein the central section includes:
a first planar surface connected to the first substrate; and
a second planar surface connected to the second substrate, and wherein the solid conductor is symmetrical about a longitudinal axis that passes through the first section, the second section and the central section.

23. The device of claim 22, wherein the first substrate includes a power component mounted thereon.

24. The device of claim 23, wherein the first substrate includes a second power component mounted thereto.

25. The device of claim 22, further comprising:
a first fillet between the first section and the first substrate; and
a second fillet between the second section and the second substrate.

26. The device of claim 25, wherein the first fillet comprises a solderable material, and wherein the second fillet comprises a solderable material.

* * * * *